United States Patent
Kuroda

(10) Patent No.: US 11,412,651 B2
(45) Date of Patent: Aug. 9, 2022

(54) CONTROL DEVICE, MOUNTING DEVICE AND CONTROL METHOD

(71) Applicant: FUJI CORPORATION, Chiryu (JP)

(72) Inventor: Hideya Kuroda, Toyota (JP)

(73) Assignee: FUJI CORPORATION, Chiryu (JP)

( * ) Notice: Subject to any disclaimer, the term of this patent is extended or adjusted under 35 U.S.C. 154(b) by 491 days.

(21) Appl. No.: 16/480,210

(22) PCT Filed: Jan. 25, 2017

(86) PCT No.: PCT/JP2017/002603
§ 371 (c)(1),
(2) Date: Jul. 23, 2019

(87) PCT Pub. No.: WO2018/138815
PCT Pub. Date: Aug. 2, 2018

(65) Prior Publication Data
US 2019/0373783 A1 Dec. 5, 2019

(51) Int. Cl.
*H05K 13/08* (2006.01)
*H05K 13/04* (2006.01)

(52) U.S. Cl.
CPC ....... *H05K 13/0882* (2018.08); *H05K 13/041* (2018.08); *H05K 13/0478* (2013.01); *H05K 13/081* (2018.08); *H05K 13/0419* (2018.08)

(58) Field of Classification Search
CPC .... H05K 13/02; H05K 13/04; H05K 13/0404; H05K 13/0408; H05K 13/0409; H05K 13/041; H05K 13/0419; H05K 13/0478; H05K 13/081; H05K 13/0812; H05K 13/0818; H05K 13/087; H05K 13/0882; H05K 13/089; Y10T 29/4913;

(Continued)

(56) References Cited

U.S. PATENT DOCUMENTS

| 2002/0029468 A1* | 3/2002 | Koike | H05K 13/0413 29/832 |
| 2002/0042989 A1* | 4/2002 | Kawase | H05K 13/041 29/832 |
| 2015/0173205 A1* | 6/2015 | Maenishi | H05K 13/085 29/832 |

FOREIGN PATENT DOCUMENTS

| EP | 1 187 524 A2 | 3/2002 |
| JP | 2007-189041 A | 7/2007 |

OTHER PUBLICATIONS

International Search Report dated Apr. 25, 2017 in PCT/JP2017/002603 filed Jan. 25, 2017.

* cited by examiner

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A control device is used for a mounting device with a mounting head including at least a first holder on which a first pickup member is installed, and a second holder on which a second pickup member is installed, and configured to pick up components supplied from a component supply section and mount the components. The control device includes a control section configured to acquire a first deviation amount of a tip of the first pickup member and a second deviation amount of a tip of the second pickup member and select a combination of the pickup members in which an interval between the tips of the pickup members that is obtained based on the first deviation amount and the second deviation amount falls within a predetermined range.

10 Claims, 9 Drawing Sheets

(58) Field of Classification Search
CPC ......... Y10T 29/49131; Y10T 29/53174; Y10T 29/53178; Y10T 29/53191
See application file for complete search history.

ently. Mounting system 10 of the present embodiment is configured, for example, as a system that executes a mounting process of mounting components P on substrate S. This mounting system 10 includes mounting device 11 and management computer (PC) 60. In mounting system 10, multiple mounting devices 11, each of which performs the mounting process of mounting components P on substrate S, are disposed from an upstream side to a downstream side. In FIG. 1, only a single mounting device 11 is illustrated for the sake of convenience in the description. Mounting

CONTROL DEVICE, MOUNTING DEVICE AND CONTROL METHOD

TECHNICAL FIELD

The present disclosure relates to a control device, a mounting device, and a control method.

BACKGROUND ART

Conventionally, as a mounting device, for example, there has been proposed a mounting device in which a rotational axis position of each of multiple suction nozzles is detected, a positional deviation amount between each rotational axis position and a nozzle tip is detected, each nozzle tip is rotated based on the information on the positional deviation amount, and a tip center position of each suction nozzle and a pickup position of a corresponding electronic component are moved relatively (for example, refer to Patent Literature 1). In this device, it is claimed that electronic components can be picked up simultaneously without errors and properly.

PATENT LITERATURE

Patent Literature 1: JP-A-2007-189041

BRIEF SUMMARY

Technical Problem

In the mounting device of Patent Literature 1, although it is described that components can be picked up simultaneously without errors by rotating the suction nozzle and changing the component pickup position, the mounting device needs complex process such as the process of changing the position of the suction nozzle and the component supply position. Thus, a mounting device has been desired which can pick up multiple components within the same process in a more ensured manner.

This disclosure has been made in view of the problem described above, and a main object of the present disclosure is to provide a control device, a mounting device, and a control method that enable multiple components to be picked up in the same process in a more ensured manner.

Solution to Problem

To achieve the main object described above, according to the disclosure made in this description, there are provided a control device, a mounting device, and a control method that are configured as below.

A control device disclosed in this description may be a control device for use in a mounting system including a mounting device with a mounting head including at least a first holder on which a first pickup member is installed, and a second holder on which a second pickup member is installed, and configured to pick up components supplied from a component supply section and mount the components, the control device including a control section configured to acquire a first deviation amount of a tip of the first pickup member and a second deviation amount of a tip of the second pickup member, and configured to select a combination of the pickup members in which an interval between the tips of the pickup members that is obtained based on the first deviation amount and the second deviation amount falls within a predetermined range.

The control device selects the combination of the pickup members in which the interval between the tips of the pickup members that is obtained based on the first deviation amount of the first pickup member and the second deviation amount of the second pickup member falls within the predetermined range. With this control device, since a more suitable combination of pickup members can be selected, multiple components can be picked up in the same process in a more ensured manner. Here, the "predetermined range" may be determined based on, for example, an interval at which components are supplied by the component supply section, and more specifically, the predetermined range may be determined to be an interval range where multiple components can be picked up without moving the mounting head. The term "within the same process" may be, for example, a period from the mounting head is disposed in the pickup position until the mounting head is moved subsequently, or may be a period from the mounting head is disposed in the pickup position until the mounting head is subsequently moved to the mounting position. Further, there may be multiple pickup members and holders, and three or more pickup members and holder may be provided. For example, when there are three pickup positions where components are picked up within the same process (for example, simultaneously), the "predetermined range" may be defined for two or more of a tip interval between a first pickup member and a second pickup member, a tip interval between the second pickup member and a third pickup member, and a tip interval between the first pickup member and the third pickup member. The "pickup member" may be a suction nozzle that picks up a component through a sucking pressure or a vacuum.

DESCRIPTION OF EMBODIMENT

Figure 1:
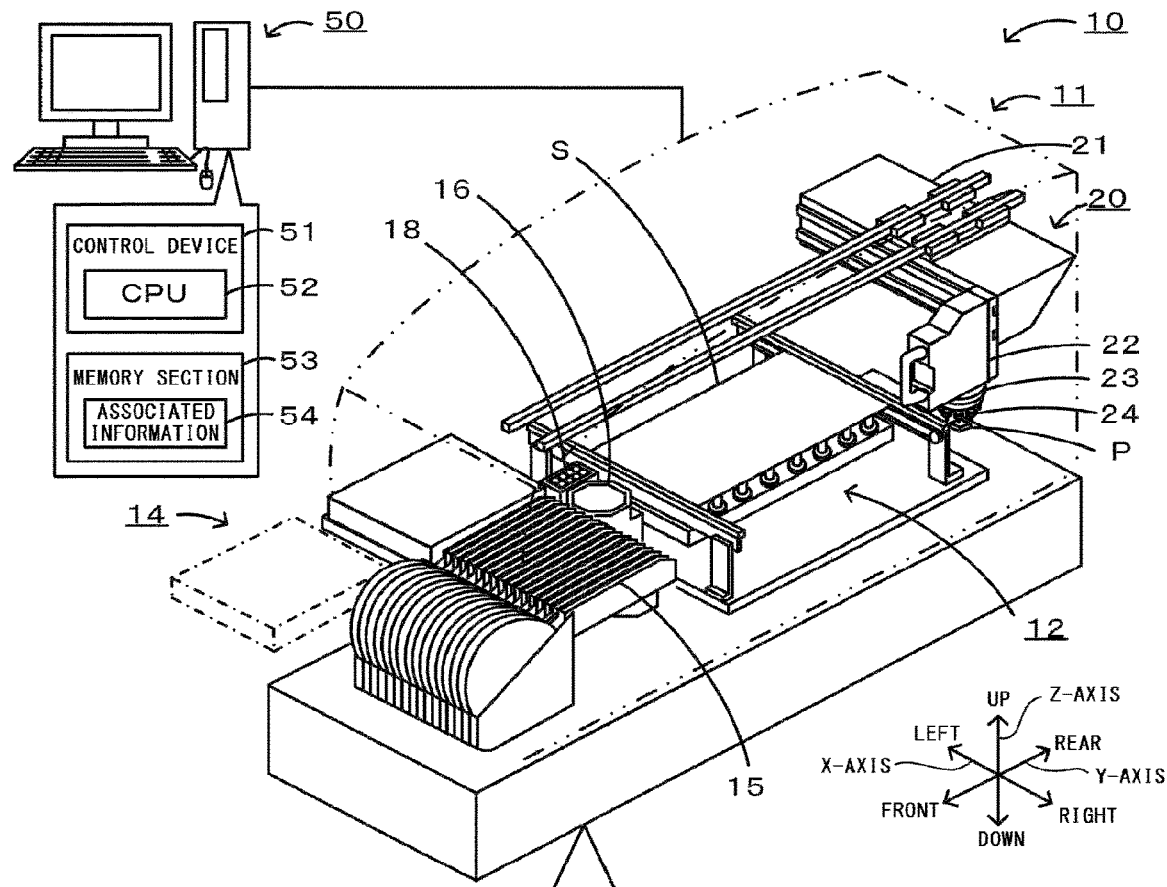
FIG. 1 is a schematic explanatory diagram showing an example of mounting system 10.
Figure 1:
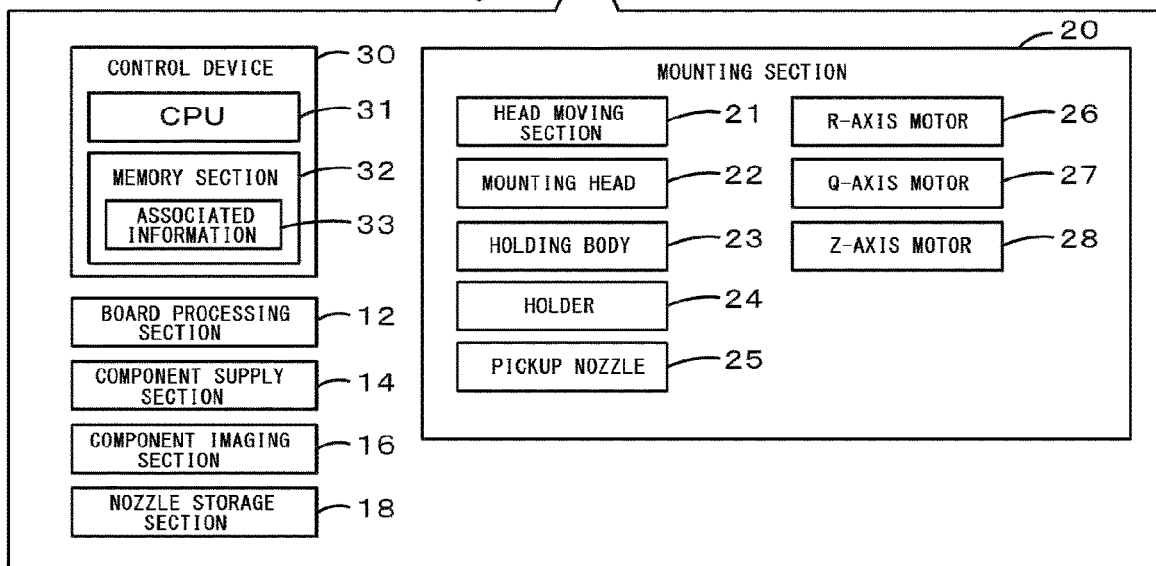
Figure 2:
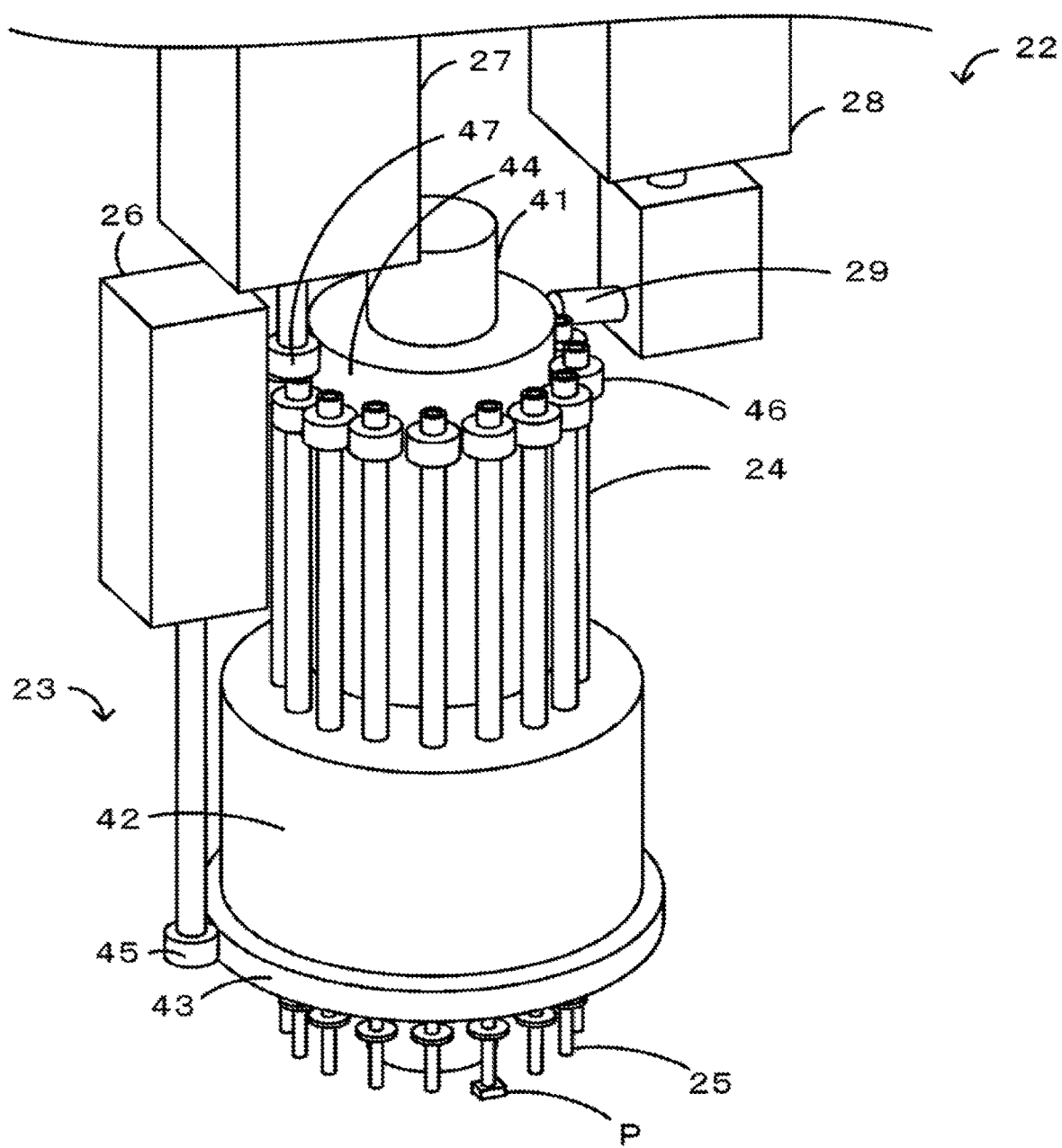
FIG. 2 is an explanatory diagram of mounting head 22.
Figure 3:
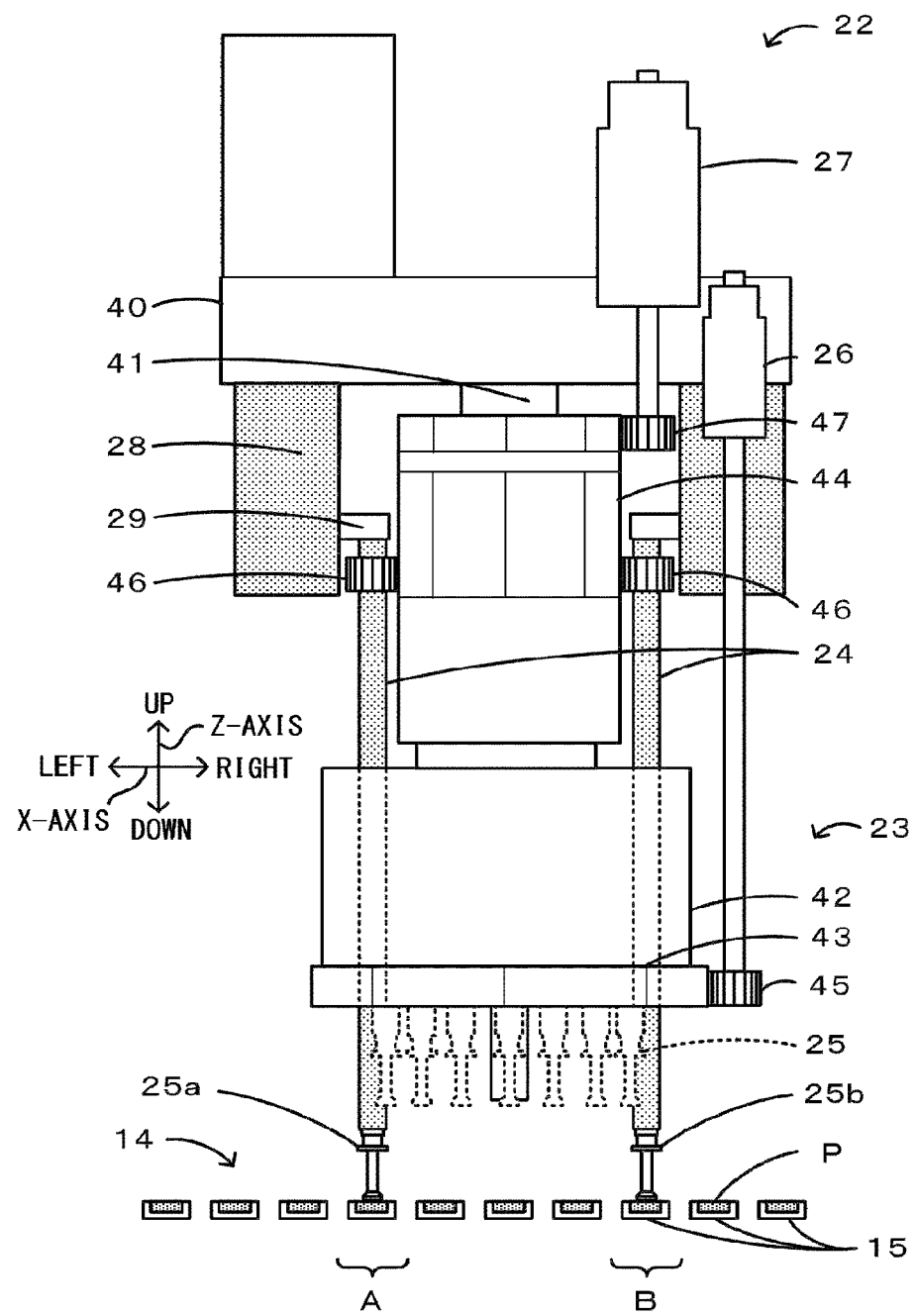
FIG. 3 is an explanatory diagram showing mounting head 22 picking up components P simultaneously.
Figure 4:
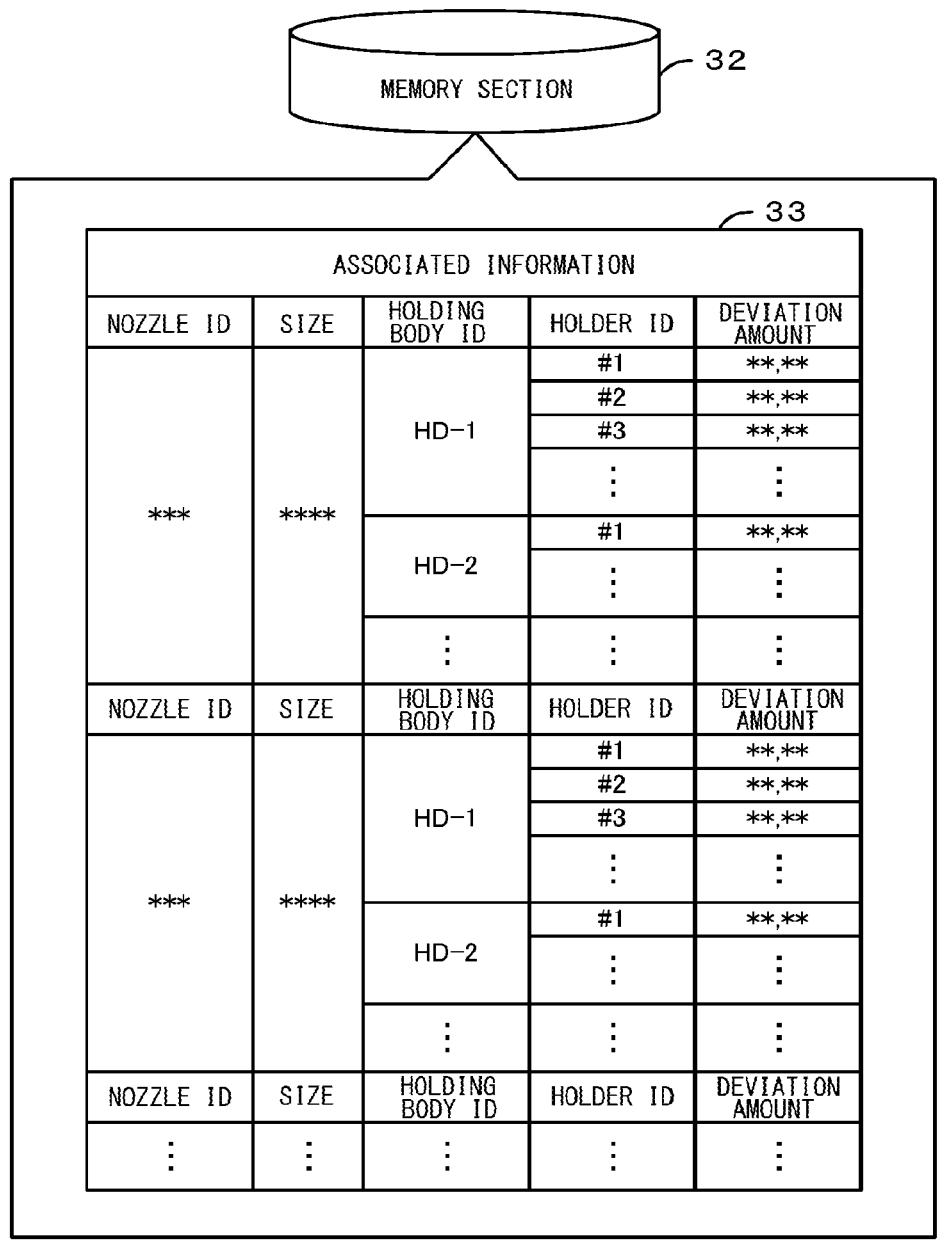
FIG. 4 is an explanatory diagram showing an example of associated pieces of information 33 stored in memory section 32.

An embodiment will be described below by reference to drawings. FIG. 1 is a schematic explanatory diagram showing an example of a mounting system 10 according to the present disclosure. FIG. 2 is an explanatory diagram of mounting head 22. FIG. 3 is an explanatory diagram showing mounting head 22 picking up components P simultaneously. FIG. 4 is an explanatory diagram illustrating an example of associated pieces of information 33 stored in memory section 32. Mounting system 10 is, for example, a system configured to execute a mounting process of mounting a component P on a board S. This mounting system 10 includes mounting device 11 and management computer (PC) 50. Mounting system 10 is configured as a mounting line along which multiple mounting devices 11 are disposed from an upstream to a downstream thereof. In FIG. 1, as a matter of convenience in description, only one mounting device 11 is shown. In this embodiment, a left-right direction (an X axis), a front-rear direction (a Y axis), and an up-down direction (a Z axis) are directions as shown in FIGS. 1 and 3.

As shown in FIG. 1, mounting device 11 includes board processing section 12, component supply section 14, component imaging section 16, nozzle storage section 18, mounting section 20, and control device 30. Board processing section 12 is a unit configured to deliver in board S, convey board S, fix board S to a mounting position, and deliver out board S. Board processing section 12 includes a pair of conveyor belts provided to be spaced apart from each other in a front-rear direction while straddling board processing section 12 in a left-right direction in FIG. 1. Board S is conveyed by the conveyor belts.

Component supply section 14 includes multiple feeders 15, each including a reel and tray units, and is detachably mounted at a front side of mounting device 11. A tape is wound around each reel, and multiple components P are held on to a surface of the tape along a longitudinal direction of the tape. The tape is unwound to the rear from the reel and is fed out to a pickup position where a component held on to the tape is picked up by suction nozzle 25 by a feeder section with the components left exposed. The tray unit includes a tray on which multiple components are rested and sends out the tray to and takes it back from a predetermined pickup position.

Component imaging section 16 (an imaging section) is an imaging device and is specifically a unit for imaging one or more components P picked up and held by mounting head 22. This component imaging section 16 is disposed between component supply section 14 and board processing section 12. An imaging range of this component imaging section 16 lies above component imaging section 16. When mounting head 22 holding component P passes over component imaging section 16, component imaging section 16 images component S and outputs the captured image data to control device 30.

Nozzle storage section 18 stores multiple suction nozzles 25 of multiple types in installation holes. Mounting head 22 exchanges suction nozzles 25 stored in nozzle storage section 18 according to types of boards S on which components are mounted or types of components S to execute a mounting process.

Mounting section 20 picks up a component P from component supply section 14 to dispose the component P on board S fixed to board processing section 12. Mounting section 20 includes head moving section 21, mounting head 22, holding body 23, nozzle holders 24, and suction nozzles 25. Head moving section 21 includes sliders, which are guided by respective guide rails to move in X and Y directions, and motors configured to drive the respective sliders. Mounting head 22 is detachably mounted on the slider, and when the head moving section 21 moves, the mounting head 22 can move in the X and Y directions accordingly. One or more suction nozzles 25 are detachably mounted on a lower surface of mounting head 22 via holding body 23. Multiple suction nozzles 25 of any type of the multiple types are mounted on holding body 23. Multiple suction nozzles 25 (for example, 16, 8, or 4 nozzles) are mounted on holding body 23 via nozzle holders 24 so as to pick up multiple components S at one time. Recess portions and projecting portions are formed on nozzle holders 24 and suction nozzles 25 or vice versa, respectively, for fitting engagement, and suction nozzles 25 are mounted in nozzle holders 24 in a predetermined axial rotational position. Suction nozzles 25 are pickup members configured to pick up a component by making use of a negative pressure or a vacuum and are detachably mounted on mounting head 22 via corresponding nozzle holders 24.

This mounting head 22 is configured as a rotary work head that is rotatably held by holding body 23. As shown in FIGS. 2 and 3, holding body 23 of mounting head 22 includes head main body 40 mounted on an X-axis slider and engagement shaft 41 provided to extend downwards from head main body 40. Holding body 23 includes rotary section 42, which is a cylindrical member, R-axis gear 43 provided underneath rotary section 42, Q-axis gear 44 provided above rotary section 42, and multiple long cylindrical nozzle holders 24 at lower ends of which suction nozzles 25 are mounted. Head main body 40 includes R-axis motor 26 configured to axially rotate rotary section 42, Q-axis motor 27 configured to axially rotate suction nozzles 25, and Z-axis motor 28 configured to move push-down section 29 to thereby raise or lower suction nozzles 25. Rotation axis of rotary section 42 is referred to as an R-axis, and a rotation axis of suction nozzle 25 is referred to as a Q-axis. Engagement shaft 41 is provided on head main body 40 in such a manner as to axially rotate and is inserted into a bottomed hole formed at a center of Q-axis gear 44 to thereby be brought into engagement with holding body 23. Rotary section 42 is a cylindrical member configured to support multiple nozzle holders 24 in such a manner as to rotate around center axes of nozzle holders 24 and move upwards and downwards. R-axis gear 43 is a circular disc-like member having a greater outside diameter than that of rotary section 42 and includes gear grooves or teeth formed on an outer circumferential surface thereof. This R-axis gear 43 is in meshing engagement with small gear 45 connected to a rotational shaft of R-axis motor 26 and is rotationally driven by R-axis motor 26 via this small gear 45. Q-axis gear 44 is a cylindrical member having a smaller outside diameter than that of rotary section 42 and includes gear grooves or teeth formed on an outer circumferential surface thereof. Nozzle holder 24 is a member including small gear 46 provided at an upper end side thereof and suction nozzle 25 provided at a lower end side thereof. Small gear 46 is in mesh engagement with the gear grooves formed on an outer circumference of Q-axis gear 44. Nozzle holders 24 are disposed at equal intervals along the outer circumference of Q-axis gear 44. Nozzle holder 24 rotates (on its own axis) around its own rotation axis (Q-axis) by a driving force of Q-axis motor 27, being transmitted by way of small gear 47 connected to Q-axis motor 27, Q-axis gear 44, and small gear 46 provided at the upper end side of nozzle holder 24, and controls an angle of a component P that is picked up. In this mounting head 22, all nozzle holders 24 rotate in synchronism with a rotation of Q-axis gear 44 as Q-axis gear 44 rotates. Nozzle holder 24 is lifted and lowered in the Z-axis direction (the up-down direction) by means of a driving force of Z-axis motor 28 transmitted via push-down section 29. In mounting head 22, nozzle holders 24 are lifted and lowered in the Z-axis direction at two locations (refer to FIG. 3) including first lifting and lowering position A positioned at a left end portion and second lifting and lowering position B positioned at a right end portion in the X-axis direction. Here, in the following description, suction nozzle 25 located in first lifting and lowering position A is referred to as suction nozzle 25a, and suction nozzle 25 located in second lifting and lowering position B is referred to as suction nozzle 25b. This mounting head 22 can pick up multiple components P from component supply section 14 with multiple suction nozzles 25 within the same process. The term "within the same process" may be, for example, a period from mounting head 22 is disposed in a pickup position until mounting head 22 is moved subsequently, or may be a period from mounting head 22 is disposed in the pickup position until mounting head 22 is subsequently moved to a mounting position. Here, the term "within in the same process" refers to a case where multiple components P are picked up simultaneously, and this is also referred to as a simultaneous pickup.

As shown in FIG. 1, control device 30 is configured as a microprocessor including mainly CPU 31 that functions as a control section and includes memory section 32 configured to store various types of data. This control device 30 outputs control signals to board processing section 12, component supply section 14, component imaging section 16, and mounting section 20 and receives signals from mounting section 20, component supply section 14, and component imaging section 16 as inputs. As shown in FIG. 4, memory section 32 stores associated information 33 in which IDs of suction nozzles 25, sizes of suction nozzles 25, an ID of holding body 23, IDs of nozzle holders 24, and deviation amounts of tips of suction nozzles 25 are associated with one another. When mounted in nozzle holder 24, depending upon a combinations of suction nozzles 25, tips of suction nozzles 25 deviate from their designed positions, or the deviation amounts of such suction nozzles 25 vary. This associated information 33 stores deviation amounts of suction nozzles 25 in association with corresponding nozzle holders 24. Therefore, with mounting device 11, the reproducibility of a deviation amount can be further enhanced by using associated information 33. In addition, memory section 32 stores information on mounting conditions including a mounting order in which components P are mounted on board S, disposing positions of components S, types of suction nozzles 25 that can pick up components P, and the like.

Management PC 50 is a computer configured to manage information on the constituent devices of mounting system 10. As shown in FIG. 1, management PC50 includes control device 51, memory section 33, a display, and an input device. Control device 51 is configured as a microprocessor including mainly CPU 52 that functions as a control section. Memory section 33 is a device such as HDD configured to store various types of data such as processing programs. The display is a liquid crystal screen configured to display various types of information thereon. The input device includes a keyboard, a mouse, and the like through which an operator inputs various types of commands. Memory section 33 stores associated information 54 similar to associated information 33 stored in memory section 32.

Figure 5:
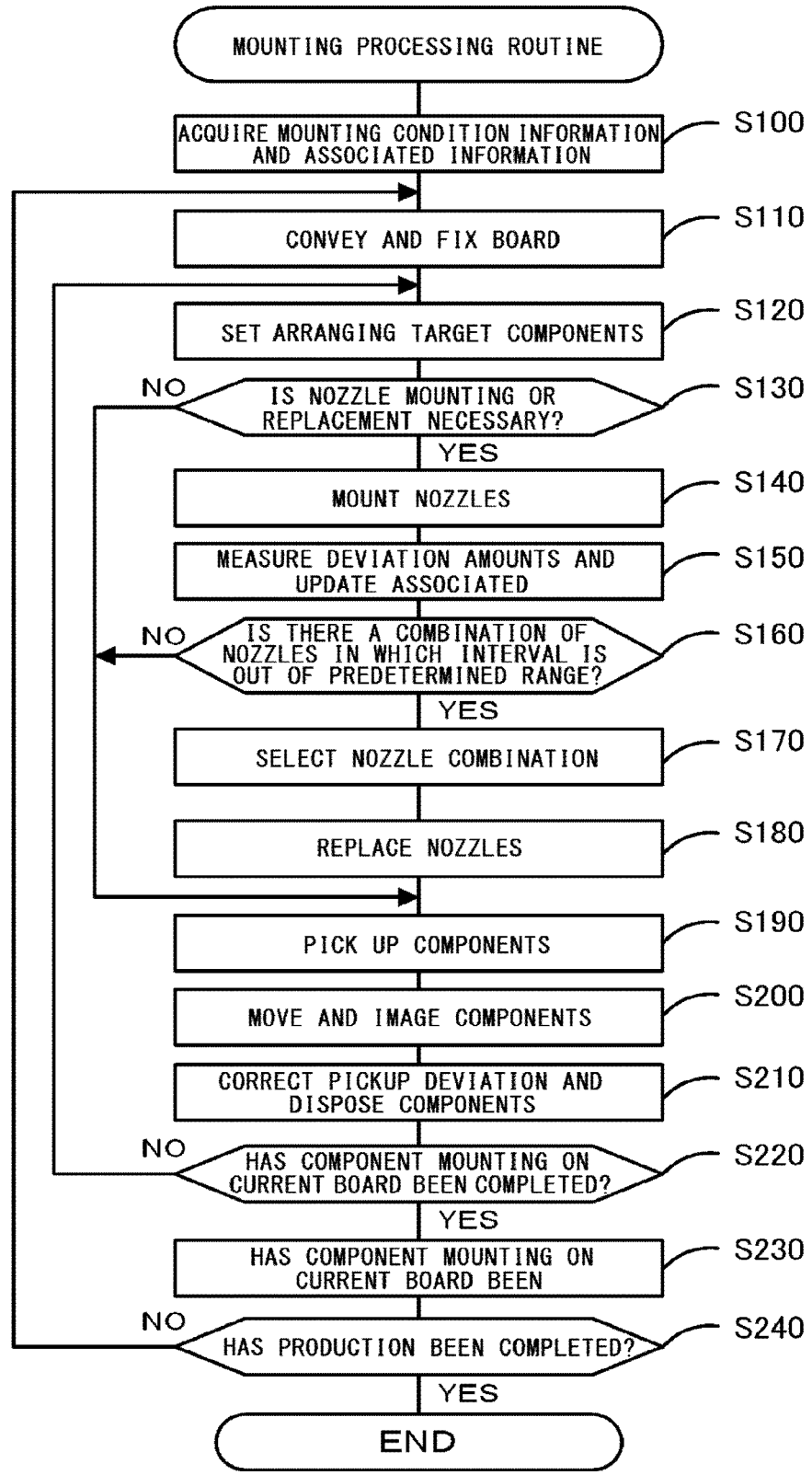
FIG. 5 is a flowchart illustrating an example of a mounting process routine.

Next, an operation of mounting system 10 of this embodiment configured as described heretofore, in particular, an operation in mounting device 11 will be described. FIG. 5 is a flowchart illustrating an example of a mounting processing routine executed by CPU 31 of control device 30. This routine is stored in memory section 32 and executed based on an input of a mounting start command by the operator. When this routine is started, CPU31 first reads out and acquires the information on mounting conditions and associated information 33 (S100) and causes board processing section 12 to carry and fix board S (S110). Next, CPU31 sets component P, which is to be picked up by suction nozzle 25 as an arrangement target component, based on an arrangement order of mounting condition information 19 (S120). Next, CPU31 determines whether suction nozzle 25 for use in picking up component P so set needs to be replaced or mounted (S130). When determining that suction nozzle 25 needs to be mounted or replaced, CPU31 mounts suction nozzle 25 stored in nozzle storage section 18 or replaces currently mounted suction nozzle 25 with one stored in nozzle storage section 18 (S140).

Figure 6:
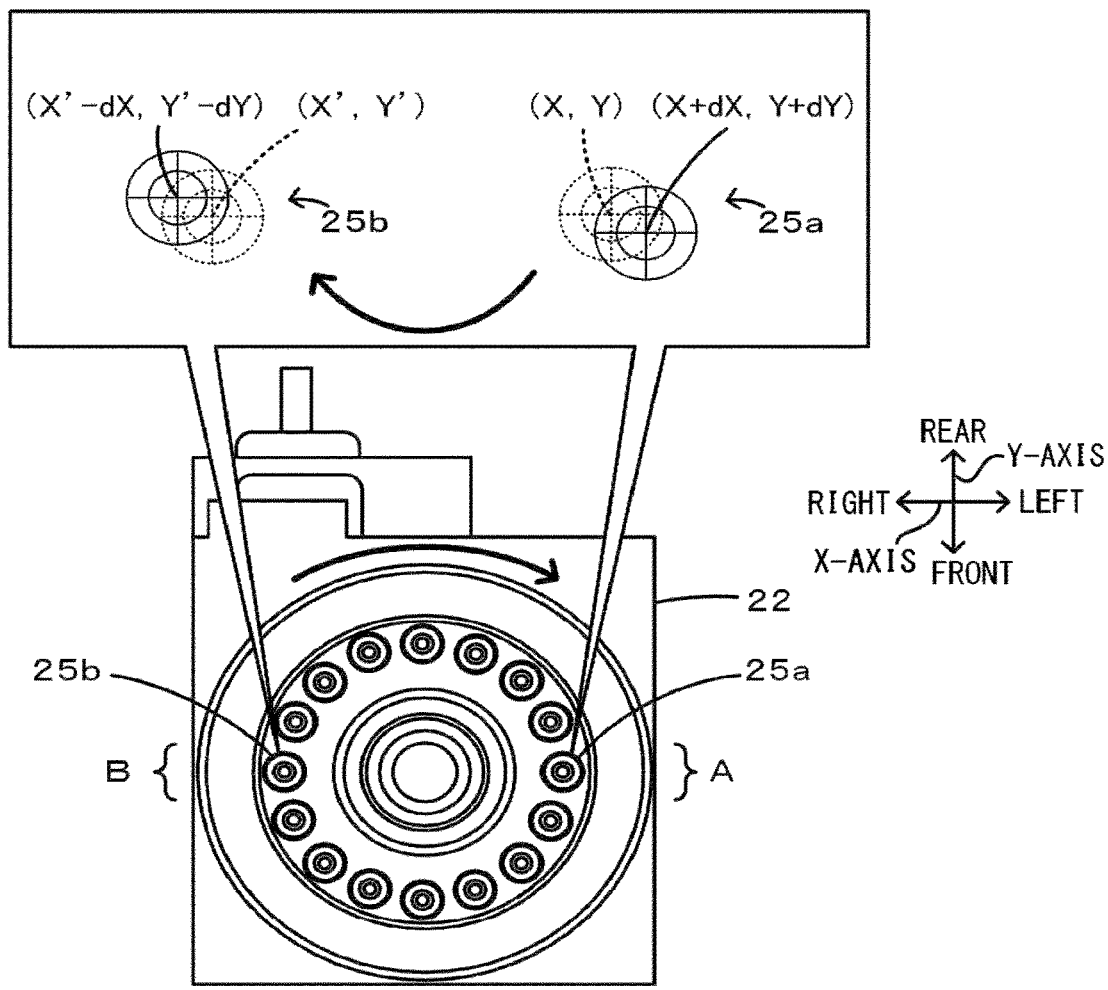
FIG. 6 is an explanatory diagram of a deviation amount of suction nozzle 25.

Next, CPU31 measures a deviation amount of a tip of suction nozzle 25, being replaced with the one mounted or being newly mounted, and stores the measured deviation amount of suction nozzle 25 in question as associated information 33, together with the identification information of suction nozzle 25 in question and the identification information of nozzle holder 24 holding that suction nozzle 25, by associating them with one another (S150). FIG. 6 is an explanatory diagram illustrating a deviation amount of suction nozzle 25. A deviation amount is measured by imaging a lower surface side of mounting head 22 by component imaging section 16 and obtaining deviation amounts of a tip of suction nozzle 25 in the X-axis direction and the Y-axis direction from its true or designed nozzle tip position by use of the image of suction nozzle 25 so imaged. For example, a deviation amount may be managed by a deviation amount dX in the X-axis direction and a deviation amount dY in the Y-axis direction when suction nozzle 25 is positioned in first lifting and lowering position A. This deviation amount of the nozzle tip is used for correcting the position of the nozzle tip when suction nozzle 25 picks up component P.

Figure 7:
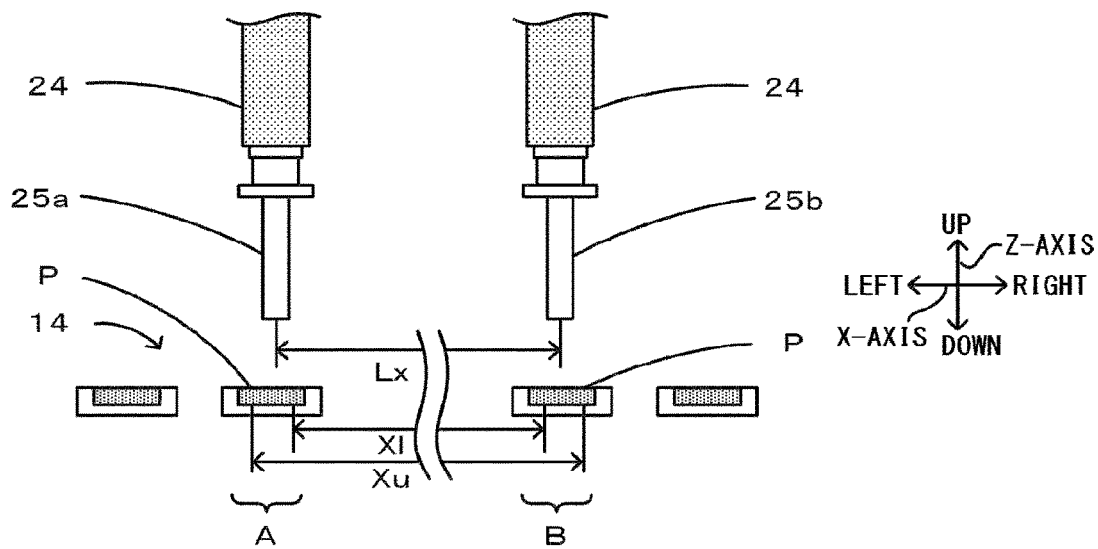
FIG. 7 is an explanatory diagram illustrating a state where interval Lx falls within a predetermined range with no deviation of suction nozzle 25.
Figure 8:
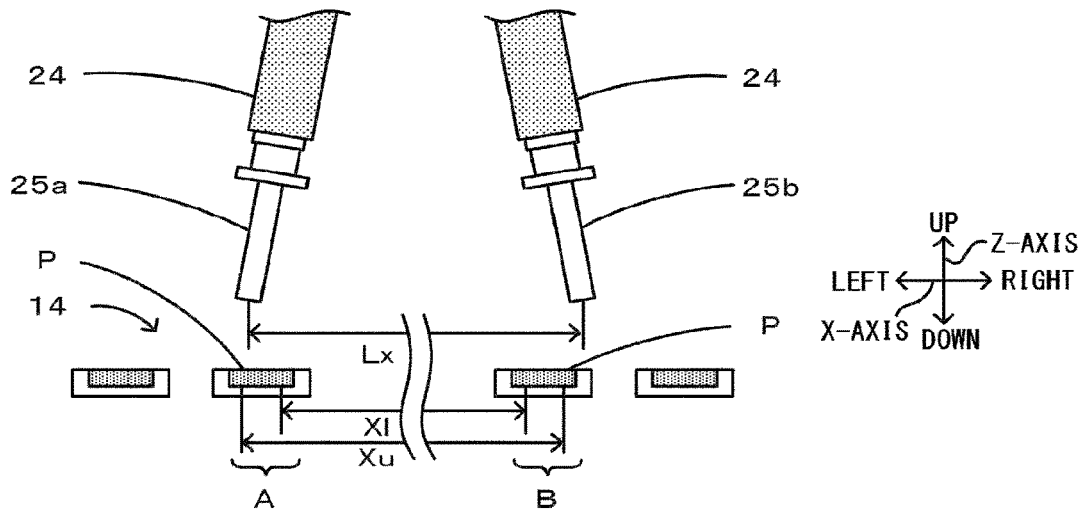
FIG. 8 is an explanatory diagram illustrating a state where interval Lx is out of the predetermined range with a deviation of suction nozzle 25.

Next, CPU31 determines whether there are combinations of suction nozzles 25 in suction nozzles 25 mounted on mounting head 22 in which an interval between nozzle tips is out of a predetermined range when suction nozzles 25 are disposed in first lifting and lowering position A and second lifting and lowering position B (S160). CPU31 can make this determination based on a determination on whether an interval Lx obtained from deviation amounts of the nozzle tips in the X-axis direction is out of the predetermined range, which is defined as a range from a reference distance Xl to a reference distance Xu, and whether an interval Ly obtained from deviation amounts of the nozzle tip in the Y-axis direction is out of the predetermined range which is defined as a range from a reference distance Yl to a reference distance Yu. FIG. 7 is an explanatory diagram illustrating a state where the interval Lx is within the predetermined range without deviations of suction nozzles 25. FIG. 8 is an explanatory diagram illustrating a state where the interval Lx is out of the predetermined range with deviations of suction nozzles 25. In FIGS. 7 and 8, only the X-axis direction is shown as a matter of convenience in illustration. The predetermined range (defined as existing between reference distances Xl and Xu, Yl and Yu) may be determined based on an interval at which components P are supplied by component supply section 14, and specifically, the predetermined range may be determined as an interval range in which multiple components P can be simultaneously picked up without moving mounting head 22. The reference distances Xl and Yl are the shortest distances between the nozzle tips at which components P can be simultaneously picked up, and the reference distances Xu and Yu are the longest distances between the nozzle tips at which components P can be simultaneously picked up.

Figure 9:
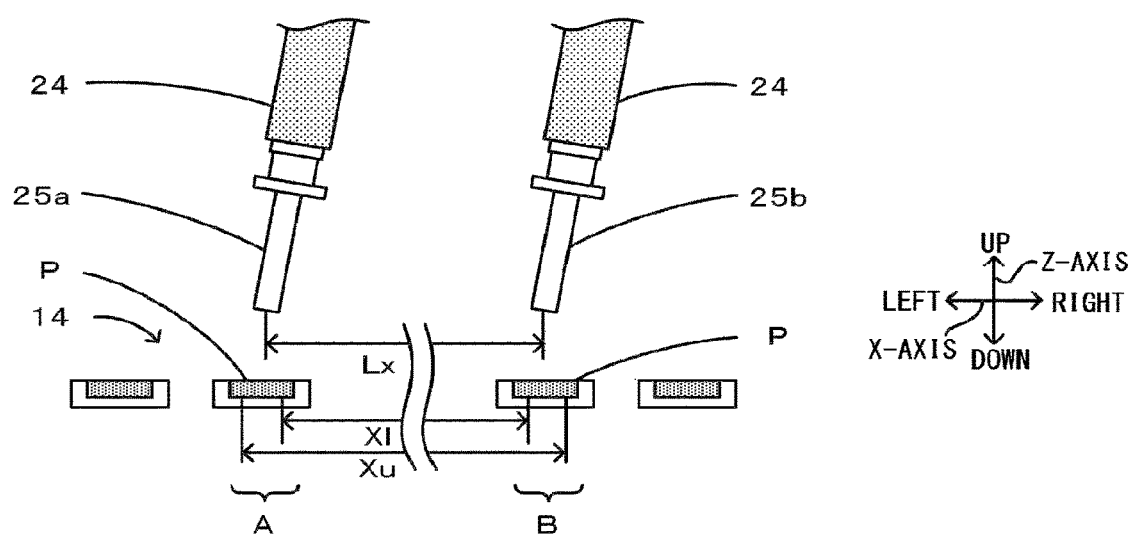
FIG. 9 is an explanatory diagram illustrating a state where interval Lx is within the predetermined range with a deviation of suction nozzle 25.

When there is a combination of suction nozzles 25 in which a nozzle tip interval is out of the predetermined range, CPU31 selects a combination of suction nozzles 25 in which a nozzle tip interval falls within the predetermined range (S170). In this process, CPU31 selects from suction nozzles 25 stored in nozzle storage section 18 suction nozzles 25 which can make a combination in which a nozzle tip interval falls in the predetermined range. For example, as shown in FIG. 6, in the case where specific suction nozzle 25 has a deviation amount (+dX, +dY) in first lifting and lowering position A, when suction nozzle 25 in question rotates and moves to second lifting and lowering position B, suction nozzle 25 then has a deviation amount (-dX,-dY). In the event that CPU 31 selects suction nozzle 25 having a deviation amount indicating a value closer to (-dX,-dY) in first lifting and lowering position A, since the deviation amount becomes (dX, dY) when suction nozzle 25 rotates to move to second lifting and lowering position B, the deviation amount is offset, and the probability that the nozzle tip interval falls within the predetermined range is increased. CPU31 selects a combination of suction nozzles 25 facing each other based on the criteria described above using the deviation amounts at nozzle holders 24 where suction nozzles 25 are mounted. When there is found no combination of suction nozzles 25 in which a nozzle tip interval falls within the predetermined range, CPU31 may cancel the simultaneous pick up of components S for suction nozzles 25 that are located in first lifting and lowering position A and second lifting and lowering position B. Following this, CPU31 causes the current combination of suction nozzles 25 to be replaced with the selected combination of suction nozzles 25 (S180). FIG. 9 is an explanatory diagram illustrating a state where although suction nozzles 25 deviate, the interval Lx stays within the predetermined range. When a preferred combination of suction nozzles 25 like the one described above is selected, even though nozzle tips deviate as shown in FIG. 9, the deviations are offset, whereby components P can be picked up simultaneously.

After S180, or when no nozzle needs to be mounted or replaced in S130, or when there is no combination of suction nozzles 25 in which a nozzle tip interval is out of the predetermined range in S160, CPU 31 causes the current combination of suction nozzles 25 to pick up arranging target components P (S190). CPU 31 moves mounting head 22 to a pickup position of component supply section 14 and causes multiple suction nozzles 25 in question to pick up components P simultaneously while taking the nozzle tip deviation amounts in consideration. Next, CPU31 causes mounting section 20 and component imaging section 16 to move and image components S held to mounting head 22, respectively (S200). For this, CPU31 moves mounting head 22 in such a manner as to pass over component imaging section 16.

Next, CPU31 causes components P to be disposed in arrangement positions on board S while correcting the deviation in pickup position and the rotation of components P held to mounting head 22 (S210). CPU31 may determine from the captured image whether components S are deformed. Subsequently, CPU31 determines whether the mounting process on the current board has been completed (S220), and if not, CPU 31 executes the processes from S120 on. That is, CPU31 sets components P to be picked up next, replaces suction nozzles 25 as required, selects a combination of suction nozzles 25 in which a nozzle tip interval falls within the predetermined range, and disposes components P on board S by correcting the deviation amounts. On the other hand, if the mounting process on the current board is determined to be completed in S220, CPU31 causes board processing section 12 to deliver out board S on which the mounting process is completed (S230) and determines whether the production of board S has been completed (S240). If determining that the production has not yet been completed, CPU 31 executes the processes from S110 on, whereas if determining that the production has been completed, CPU 31 ends the routine as it is.

Figure 10:
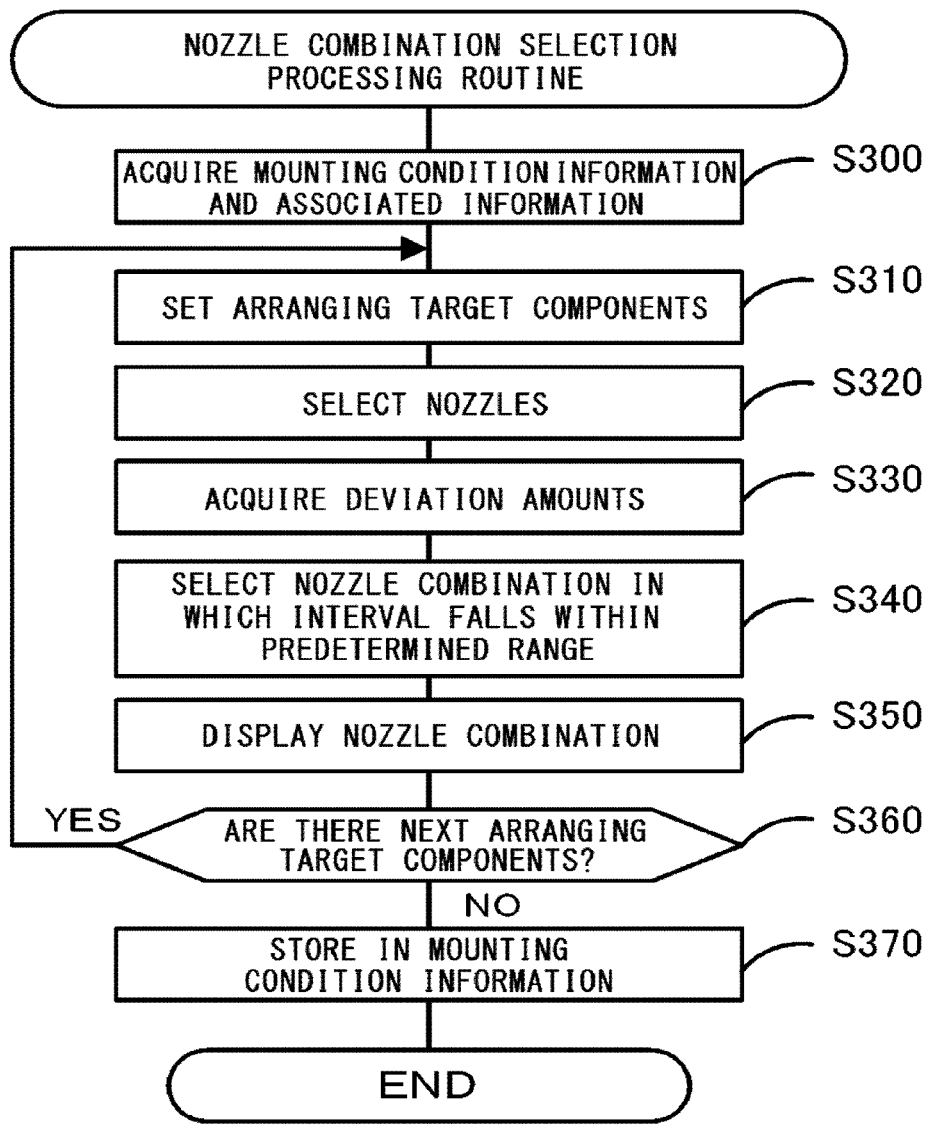
FIG. 10 is a flowchart illustrating an example of a nozzle combination selection processing routine.

Next, a process in which management PC 50 selects a preferred combination of suction nozzles 25 will be described. Managing nozzle tip deviation amounts in management PC 50 helps designate individual nozzles using the mounting condition information or enables good combinations of suction nozzles 25 to be disposed in nozzle storage section 18. FIG. 10 is a flowchart illustrating an example of a nozzle combination selection processing routine executed by CPU 52 of control device 51. This routine is stored in memory section 53 and is executed based on an input of a start command by the operator to start the selection of a combination of suction nozzles 25. Here, let's assume that although the arrangement order of components S and the designation of types of nozzles to be used are stored in the mounting condition information, the designation of individual nozzles has not yet been stored therein. When starting the routine, CPU52 first reads out and acquires the mounting condition information and associated information 54 (S300), sets arranging target components S (S310), and selects the type of suction nozzles 25 to be used (S320). Let's assume that associated information 54 is updated as required by associated information 33 that is updated by mounting device 11. Next, CPU52 acquires tip deviation amounts of suction nozzles 25 from associated information 54 and selects a combination of suction nozzles 25 in which a nozzle tip interval falls within the predetermined range (S340). CPU 52 executes this selection processing in the same manner as the manner executed in S170 described above and selects suction nozzles 25 by taking a combination with nozzle holders 24 in consideration.

Next, CPU52 displays the details of the selection made (S350). CPU 52 may cause identification information on suction nozzles 25 selected to be displayed on the display as required. At this time, CPU 52 may display on the display a display screen from which the operator can visualize suction nozzles 25 being stored in nozzle storage section 18 as a combination or set of suction nozzles 25. Next, CPU52 determines whether there are arranging target components P to be disposed next based on the information on the mounting order in the mounting condition information (S360), and when determining that there are arranging target components P to be disposed next, CPU 52 executes the operations from S310 on. On the other hand, when determining that there is no arranging target component P to be disposed next in S360, CPU 52 causes the individual combinations of suction nozzles 25 selected in S340 to be stored in the mounting condition information (S370) and ends this routine. In this manner, by selecting preferred combinations of suction nozzles 25 in management PC 50, good nozzle sets can be set in advance.

Here, a correlation between the constituent elements of this embodiment and constituent elements of the disclosure will be clarified. Control device 30 and control device 51 of this embodiment correspond to a control device of the disclosure, CPU 31 and CPU 52 correspond to a control section, suction nozzle 25 corresponds to a pickup member, and nozzle holder 24 corresponds to a holder. In addition, memory section 32 and memory section 53 correspond to a memory section, mounting head 22 corresponds to a mounting head, component supply section 14 corresponds to a component supply section, and component imaging section 16 corresponds to an imaging section. In this embodiment, an example of a control method of the disclosure is clarified by describing the operations of control device 30 and control device 51.

Mounting device 11 of this embodiment that has been described heretofore includes mounting head 22 including multiple nozzle holders 24 in which suction nozzles 25 are mounted and control device 30 configured to pick up components P supplied from component supply section 14 for mounting. This control device 30 acquires the tip deviation amount of suction nozzle 25a and the tip deviation amount of suction nozzle 25b and selects the combination of suction nozzles 25 in which the nozzle tip interval obtained based on those deviation amounts falls within the predetermined range. According to control device 30, since the combination of suction nozzles 25 that is more suitable for picking up components S within the same process can be selected, multiple components S can be picked up within the same process in a more ensued manner. According to management PC 50, since the selected combination of suction nozzles 25 can be outputted for display, the operator can confirm the combination of suction nozzles 25 outputted and displayed, whereby the operator can set in advance preferred suction nozzles 25 in nozzle storage section 18.

In addition, CPU 31 acquires the IDs of suction nozzles 25 (the identification information), the IDs of nozzle holders 24 indicating deviation amounts, and the deviation amounts at the tips of suction nozzles 25 and stores the acquired nozzle IDs, holder IDs, and deviation amounts as associated information 33 in which those acquired are associated with one another in memory section 32. According to control device 30, by managing associated information 33, for example, a combination of suction nozzles 25 enabling components P to be picked up within the same process can be selected in advance. Alternatively, according to control device 30, by using associated information 33 stored in advance, measuring deviation amounts can be omitted. CPU52 can select the combinations of suction nozzles 25 in which the tip interval between suction nozzles 25 falls within the predetermined range by use of associated information 54. CPU 31 determines whether the tip interval between suction nozzles 25 is within the predetermined range, and when determining that the nozzle tip interval stays within the predetermined range, CPU 31 causes mounting head 22 to pick up components S from component supply section 14 using suction nozzles 25a, 25b within the same process. According to this mounting device 11, multiple components P can be picked up within the same process in a more ensured manner.

According to mounting device 11, since the combination of suction nozzles 25 in which the nozzle tip interval falls within the predetermined range is selected and suction nozzles 25 so selected are mounted on mounting head 22, more suitable suction nozzles 25 can be selected for mounting on mounting head 22, whereby multiple components P can be picked up within the same process in a more ensured manner. According to mounting device 11, component imaging section 16 is caused to image mounting head 22 on which suction nozzles 25 are mounted, and the deviation amounts at the tips of suction nozzles 25 are acquired based on the captured image, whereby the deviation amounts at the tips of suction nozzles 25 can be measured using the captured image.

The control device and the mounting device of this disclosure are not limited to the embodiment that has been described heretofore, and hence, needless to say, the control device and the mounting device can be carried out in various modes without departing from the technical scope of the disclosure.

For example, in the embodiment that has been described heretofore, the combination of suction nozzles 25 is described as being displayed on the display by management PC 50; however, the combination of suction nozzles 25 may be displayed on a display section of a control panel of mounting device 11. Alternatively, the display of the combination of suction nozzles 25 may be omitted in management PC 50 and mounting device 11. Even with mounting device 11 and management PC 50 modified as described above, multiple components P can be picked up within the same process in a more ensured fashion by making use of the selected combination of suction nozzles 25.

In the embodiment described above, components S are described as being picked up simultaneously at the two locations, that is, in first lifting and lowering position A and second lifting and lowering position B, components P may be picked up simultaneously at three or more locations. For example, with three pickup positions, the "predetermined range" may be determined for two or more in a tip interval between first and second suction nozzles 25, a tip interval between second and third suction nozzles 25, and a tip interval between first and third suction nozzles 25.

In the embodiment described above, the combination of suction nozzles 25 is described as being selected in which the nozzle tip interval falls within the predetermined range in relation to the X-axis direction and the Y-axis direction; however, the disclosure is not particularly limited to this configuration, and hence, for example, a configuration may be adopted in which a combination of suction nozzles 25 is selected in which a nozzle tip interval falls within the predetermined range only in relation to the X-axis direction, and the nozzle tip interval in the Y-axis direction may be dealt with by changing the tape feeding amount of component supply section 14. In the mounting device so modified, too, multiple components can be picked up within the same process in a more ensured manner.

In the embodiment described above, although mounting head 22 is described as including 16 nozzle holders 24, the number of nozzle holders 24 is not particularly to this configuration, provided that two or more nozzle holders 24 are provided.

In the embodiment described above, although not specifically described, mounting device 11 or management PC50 may also manage combinations of suction nozzles 25 where specific suction nozzles 25 are well combined with each other as associated information 33.

In the embodiment described above, although the combinations of suction nozzles 25 are described as being selected by control device 30 and control device 51, combinations of suction nozzles 25 may be selected only either of the control devices. However, to execute the simultaneous pickup in a more ensured fashion, combinations of suction nozzles 25 are preferably selected by both control device 30 and control device 51.

In the embodiment described above, although all nozzle holders 24 on mounting head 22 are described as axially rotating in synchronism with one another, the disclosure is not particularly limited to this configuration, and hence, nozzle holders 24 may axially rotate separately or individually. However, the configuration in which all nozzle holders 24 axially rotate in synchronism with one another is more significant and preferred in terms of application of the contents of this disclosure.

Here, in the control device of this disclosure, the control section may be configured to output for display the selected combination of pickup members. According to this control device, the operator can confirm the combination of pickup members so outputted and displayed and hence, for example, the operator can set preferred combinations of pickup members in advance.

The control device disclosed in this description may have a configuration in which the control device includes a memory section, and the control section acquires identification information of the pickup members, identification information of the holders indicating the deviation amounts, and tip deviation amounts of the pickup members and stores the identification information on the pickup members, the identification information on the holders, and the tip deviation amounts of the pickup members that are so acquired in the memory section as associated information where those pieces of information and the tip deviation amounts are associated with one another. According to this control device, by managing the associated information, for example, combinations of pickup members which can pick up components within the same process can be selected in advance. Alternatively, according to this control device, measuring deviation amounts can be omitted by using the associated information stored in advance. For this, the control section may select the combination of pickup members in which the tip interval of the pickup members falls within the predetermined range by using the associated information.

A mounting device disclosed in this description may include: a mounting head including at least a first holder installing a first pickup member and a second holder installing a second pickup member; a component supply section configured to supply components to the mounting head; and any one of the control devices described above.

According to this mounting device, since the any one of the control devices described above, multiple components can be picked up within the same process in a more ensured manner.

In the mounting device disclosed in this description, a configuration may be adopted in which the control section determines whether a tip intervals of the pickup members falls within a predetermined range, and when determining that the tip interval falls within the predetermined range, the control section causes the mounting head to pick up the components from the component supply section using the first pickup member and the second pickup member within the same process. According to this mounting device, multiple components can be picked up within the same process in a more ensured manner.

In the mounting device disclosed in this description, the control section acquires a first deviation amount of the tip of the first pickup member and a deviation amount at the tip of the second pickup member, selects a combination of pickup members in which a tip interval between the pickup members that is obtained based on the first deviation amount and the second deviation amount falls within the predetermined range, and mounts the selected combination of pickup members on the mounting head. According to this mounting device, since a more suitable combination of pickup members can be selected and mounted, multiple components can be picked up within the same process in a more ensured manner.

A mounting device disclosed in this description may have a configuration in which the mounting device includes an imaging section configured to image the mounting head, and the control section obtains tip deviation amounts of the pickup members based on a captured image of the mounting head resulting from causing the imaging section to image the mounting head installing the pickup members. According to this mounting device, the deviation amounts at the tip of the pickup members can be measured by use of the captured image. The mounting device may have a configuration in which the imaging section images the components picked up by the mounting head, and the control section obtains deviation amounts of the components based on the captured image.

A control method disclosed in this description may be a method for use for a mounting system including a mounting device with a mounting head including at least a first holder, installing a first pickup member, and a second holder, installing a second pickup member, and configured to pick up components supplied from a component supply section for mounting, the control method including: (a) a step of acquiring a first deviation amount at a tip of the first pickup member and a second deviation amount at a tip of the second pickup member; and (b) a step of selecting a combination of pickup members in which a tip interval between the pickup members obtained based on the first deviation amount and the second deviation amount falls within a predetermined range.

According to this control method, as with the control device described above, since a more suitable combination of pickup members can be selected, multiple components can be picked up within the same process in a more ensured manner. In this control method, various modes of the control device and the mounting device that are described above may be adopted, or configurations to realize the respective functions of the control device and the mounting device may be added.

INDUSTRIAL APPLICABILITY

This disclosure can be applied to the technical field of a device configured to perform a mounting process in which components are picked up and disposed for mounting.

REFERENCE SIGNS LIST

10 mounting system, 11 mounting device, 12 board processing section, 14 component supply section, 15 feeder, 16 component imaging section, 18 nozzle storage section, 20 mounting section, 21 head moving section, 22 mounting head, 23 holding body, 24 nozzle holder, 25 suction nozzle, 26 R-axis motor, 27 Q-axis motor, 28 Z-axis motor, 29 push-down section, 30 control device, 31 CPU, 32 memory section, 33 associated information, 40 head main body, 41 engagement shaft, 42 rotary section, 43 R-axis gear, 44 Q-axis gear, 45 to 47 small gear, 50 management PC, 51 control device, 52 CPU, 53 memory section, 54 associated information, A first lifting and lowering position, B second lifting and lowering position, P-component, S board, dX, dY deviation amount, Lx, Ly interval, Xl, Xu, Yl, Yu reference distance.

The invention claimed is:

1. A control device for use in a mounting system including a mounting device with a mounting head including at least a first holder on which a first pickup member of a plurality of pickup members is installed, and a second holder on which a second pickup member of the plurality of pickup members is installed, and configured to pick up components supplied from a component supply section and mount the components, the control device comprising:

control circuitry configured to acquire a first deviation amount of a tip of the first pickup member and a second deviation amount of a tip of the second pickup member, determine a distance between the tip of the first pickup member and the tip of the second pickup member, based on the first and second deviation amounts, determine whether the determined distance falls within a predetermined range, wherein if the determined distance falls within the predetermined range, the control circuitry is further configured to select the first pickup member and the second pickup member, and if the determined distance does not fall within the predetermined range, the control circuitry selects a combination of two particular pickup members of the plurality of pickup members such that a distance between tips of the two particular pickup members fails within the predetermined range, and wherein the control circuitry is further configured to control the mounting head to simultaneously pickup the components from the component supply section with the selected pickup members.

2. The control device according to claim 1, wherein the control circuitry is further configured to output and cause to be displayed the selected combination of the particular pickup members.

3. The control device according to claim 1, wherein the control device further comprises a memory to store information, and wherein the control circuity is further configured to acquire identification information of each of the plurality of pickup members, identification infounation of corresponding holders of the plurality of pickup members, and deviation amounts of corresponding tips of the plurality of pickup members, and store the identification information of the pickup members, the identification information of the holders, and the deviation amounts in the memory in association with one another.

4. The control device of claim 1, wherein the control circuitry is further configured to determine a first distance between the tips of the first and second pickup members in a first direction, determine a second distance between the tip of the first and second pickup members in a second direction orthogonal to the first direction, determine whether the first distance falls within the predetermined range, and determine whether the second distance falls within another predetermined range corresponding to the second direction.

5. The control device of claim 1, wherein the control circuitry is further configured to select the two particular pickup members, which are other than the first and second pickup members.

6. A mounting device, comprising:
the mounting head including at least the first holder on which the first pickup member is installed and the second holder on which the second pickup member is installed;
the component supply section configured to supply the components to the mounting head; and
the control device according to claim 1.

7. The mounting device according to claim 6,
wherein the control circuitry is further configured to determine whether the distance between the first and second pickup members falls within the predetermined range, and when determining that the distance between the first and second pickup members falls within the predetermined range, cause the mounting head to pick up the components from the component supply section using the first pickup member and the second pickup member within a same process.

8. The mounting device according to claim 6,
wherein the control circuitry is further configured to acquire the first deviation amount of the tip of the first pickup member and the second deviation amount of the tip of the second pickup member, select the combination of the two particular pickup members in which the distance between the tips of the two particular pickup members falls within the predetermined range, a mount the selected two particular pickup members on the mounting head.

9. The mounting device according to claim 6, further comprising an imaging section configured to image the mounting head, and
wherein the control circuitry is further configured to acquire the deviation amounts of the tips of the first and second pickup members, based on an image captured by the imaging section of the mounting head on which the first and second pickup members are installed.

10. A control method performed by control circuitry of a control device for use for a mounting system including a mounting device with a mounting head including at least a first holder on which a first pickup member, of a plurality of pickup members, is installed, and a second holder on which a second pickup member, of the plurality of pickup members, is installed, and configured to pick up components supplied from a component supply section and mount the components, the control method comprising:
acquiring, by the control circuitry, a first deviation amount at a tip of the first pickup member and a second deviation amount at a tip of the second pickup member; and
determining, by the control circuitry, a distance between the tip of the first pickup member and the tip of the second pickup member, based on the first and second deviation amounts;
determining, by the control circuitry, whether the determined distance fails within a predetermined range,
wherein if the determined distance falls within the predetermined range, selecting, by the control circuitry, the first pickup member and the second pickup member, and if the determined distance does not fall within the predetermined range, selecting, by the control circuitry, a combination of two particular pickup mernbers of the plurality of pickup members such that a distance between tips of the two particular pickup members falls within the predetermined range, and
controlling, by the control circuitry, the mounting head to simultaneously pickup the components from the component supply section with the selected pickup members.

* * * * *